(12) United States Patent  
Jousseaume et al.

(10) Patent No.: US 8,231,797 B2
(45) Date of Patent: Jul. 31, 2012

(54) PROCESS FOR PRODUCING AIR GAPS IN MICROSTRUCTURES

(75) Inventors: Vincent Jousseaume, Le Sappey En Chartreuse (FR); Aziz Zenasni, Gieres (FR)

(73) Assignee: Commissariat a l'Energie Atomique, Paris (FR)

( * ) Notice: Subject to any disclaimer, the term of this patent is extended or adjusted under 35 U.S.C. 154(b) by 495 days.

(21) Appl. No.: 12/353,872

(22) Filed: Jan. 14, 2009

(65) Prior Publication Data
US 2009/0178999 A1    Jul. 16, 2009

(30) Foreign Application Priority Data

Jan. 16, 2008 (FR) .................................... 08 50249

(51) Int. Cl.
*B31D 3/00* (2006.01)
*B32B 3/10* (2006.01)
*H01L 21/44* (2006.01)
*C03C 15/00* (2006.01)

(52) U.S. Cl. ............ 216/56; 428/131; 438/619; 216/95; 216/83

(58) Field of Classification Search .................. None
See application file for complete search history.

(56) References Cited

U.S. PATENT DOCUMENTS

| 6,204,165 | B1* | 3/2001 | Ghoshal ........................ 438/619 |
| 6,387,818 | B1 | 5/2002 | Lopatin |
| 6,514,855 | B1* | 2/2003 | Suzuki et al. ................. 438/637 |
| 2002/0022378 | A1 | 2/2002 | Baklanov et al. |
| 2003/0042613 | A1* | 3/2003 | Shioya et al. ................. 257/762 |
| 2004/0175883 | A1* | 9/2004 | Kim .............................. 438/244 |
| 2007/0045861 | A1* | 3/2007 | Ohto et al. .................... 257/774 |
| 2008/0314520 | A1* | 12/2008 | Chiba et al. ................. 156/345.1 |

FOREIGN PATENT DOCUMENTS

| DE | 103 55 395 A1 | 6/2005 |
| EP | 1 739 737 A1 | 1/2007 |

OTHER PUBLICATIONS

French Patent Office Search Report, dated Oct. 8, 2008—(2 pages).

* cited by examiner

*Primary Examiner* — Shamim Ahmed
*Assistant Examiner* — Bradford Gates
(74) *Attorney, Agent, or Firm* — Brinks Hofer Gilson & Lione

(57) ABSTRACT

A process for producing at least one air gap in a microstructure, which includes the supply of a microstructure comprising at least one gap filled with a sacrificial material, this gap being limited over at least part of its surface by an impermeable membrane but which may be rendered permeable by the action of a chemical etchant, this etchant also being capable of degrading the sacrificial material and the contacting of the microstructure with said chemical etchant in order to make the membrane permeable and degrade the sacrificial material, and the removal of the chemical etchant from the microstructure and in which the chemical etchant is a fluid containing hydrofluoric acid and/or ammonium fluoride. Applications include microelectronics and micro-technology.

20 Claims, 1 Drawing Sheet

PROCESS FOR PRODUCING AIR GAPS IN MICROSTRUCTURES

TECHNICAL FIELD

The present invention relates to a process for producing air gaps in microstructures.

In the foregoing and in what follows, the term "air gap" is used to denote a cavity which may be filled with air, with a gas other than air, and in particular with an inert gas such as argon, or else may be a vacuum.

The present invention is particularly capable of being used in the fabrication of air-gap interconnect structures for integrated circuits. However, it may also be useful for producing other types of air-gap microstructures such as, for example, MEMS (microelectromechanical systems) having resonant cavities of the BAW (bulk acoustic wave) type, or else microbatteries.

BACKGROUND

The fabrication of devices in microelectronics or in microtechnology requires, in the most advanced approaches, the production of air gaps.

To produce these air gaps, one of the current approaches consists in degrading a sacrificial material, typically silicon oxide, by means of a chemical etchant, for example hydrofluoric acid, which must pass through a membrane in order to reach this material.

An example of the production of air gaps using this approach, in the case of a structure having two levels of interconnects for integrated circuits, is illustrated schematically in FIGS. 1A and 1B.

As may be seen in FIG. 1A, which shows the structure before the air gaps are formed, said structure comprises:

a substrate 10;

a first layer 11 of a sacrificial material which covers this substrate and embedded in which are metal lines 12a and 12b, typically made of copper;

a permeable membrane 13 which covers the layer 11 and the metal lines 12a and 12b and which delimits, together with the substrate 10 and said metal lines, cavities 15 filled with sacrificial material; and a second layer 11' of sacrificial material, which covers the permeable membrane 13 and embedded in which are metal lines 12c and 12d, said lines being connected to the metal lines 12a and 12b respectively by means of metal vias 14 that extend right through the thickness of the membrane 13.

The contacting (shown symbolically by the bold arrows in FIG. 1A) of the structure with an agent capable of degrading the sacrificial material causes the degradation of the second layer 11' of sacrificial material and then, after the etchant has diffused through the permeable membrane 13, that of the first layer 11 of sacrificial material. All that is then required is to remove the chemical etchant from the structure (together with all the degradation residues that it contains), for example using supercritical carbon dioxide, in order for the cavities 15 initially filled with sacrificial material to become air gaps, as illustrated in FIG. 1B.

In addition to being able to let the chemical etchant pass through it, the membrane must satisfy a very precise specification, namely:

it must itself resist the chemical etchant;

it must be compatible with the various processes and treatments used to produce the structure in which it is integrated (metallization operations, chemical-mechanical polishing operations, thermal annealing operations, and the like) and, in particular, it must be stable to temperatures that may reach 400° C.;

it must have good mechanical properties since it forms part of the framework of the structure; and it must have a low dielectric constant, in particular at most equal to 4.0, in the case of an interconnect structure for integrated circuits.

The permeable membranes currently used are generally membranes made of polymers.

However, the integration of such membranes into microstructures, and in particular into air-gap interconnect structures for integrated circuits, cannot be accomplished without posing a number of problems.

This is because, owing to their permeability, these membranes may be infiltrated by the various chemicals that are employed during the fabrication of the microstructures and, in particular, during the operations of etching, stripping, cleaning and depositing the metals needed to produce the metal lines, thereby tending to embrittle these membranes and exposing them to a serious risk of degradation.

In addition, the fact that these polymer-type membranes are not very mechanically strong also poses problems during the implementation of abrasive operations, such as chemical-mechanical polishing operations.

SUMMARY

The invention really solves these problems since it provides a process for producing at least one air gap in a microstructure, of the type comprising the degradation of a sacrificial material by diffusion of a chemical etchant through a membrane, which comprises:

a) the supply of a microstructure comprising at least one gap filled with a sacrificial material, this gap being limited over at least part of its surface by an impermeable membrane but which may be rendered permeable by the action of a chemical etchant capable of degrading the sacrificial material;

b) the contacting of the microstructure with said chemical etchant in order to make the membrane permeable and degrade the sacrificial material; and c) the removal of the chemical etchant from the microstructure, whereby an air gap is obtained; and in which the chemical etchant is a fluid containing hydrofluoric acid or ammonium fluoride possibly as a mixture with hydrofluoric acid.

Thus, according to the invention, the membrane that is integrated into the microstructure is a membrane which is impermeable but can be made permeable subsequently by subjecting it to the action of a chemical etchant, which is also capable of acting on the sacrificial material in order to degrade it.

It therefore suffices to bring the microstructure into contact with the chemical etchant in order to simultaneously obtain the conversion of the impermeable membrane into a permeable membrane, the diffusion of this etchant through this membrane and the degradation of the sacrificial material, and then to remove said chemical etchant from the microstructure in order to obtain an air gap.

According to a first preferred method of implementing the process of the invention, the impermeable membrane consists of a single material, in which case this material preferably comprises silicon, carbon, hydrogen, oxygen and, possibly, nitrogen and/or fluorine, with a majority of silicon-carbon bonds and a proportion of silicon-oxygen bonds such that the oxygen present in said material represents at most 30% of the atoms by number.

Specifically, such a membrane may be rendered permeable through the action of a chemical etchant capable of selectively destroying the silicon-oxygen bonds that it contains (in particular without touching the other bonds and, in particular, the silicon-carbon, silicon-hydrogen and carbon-hydrogen bonds) and, thereby, giving it an open porosity over its entire thickness. This is particularly the case for an aqueous hydrofluoric acid solution.

In the foregoing and what follows, it is considered that a material comprises a majority of silicon-carbon bonds when more than 50% of the bonds formed by the silicon atoms present in this material are silicon-carbon bonds.

In accordance with the invention, the material comprising silicon, carbon, hydrogen, oxygen and, possibly, nitrogen and/or fluorine is preferably of the $Siv CwHyOz$ or $SivCwNxHyOz$ type where v, w, x, y and z are all different from 0.

Membranes consisting of a material of this type may be formed in particular by the technique of PECVD (plasma-enhanced chemical vapour deposition).

To obtain a membrane of the $SivCwHyOz$ type, it is therefore preferable to use a plasma containing an organosilicon first precursor containing no oxygen and a second precursor consisting of oxygen, alone or in combination with carbon and/or hydrogen, while, to obtain a membrane of the $SivCwNxHyOz$ type, it is preferable to add to this plasma a third precursor consisting of nitrogen, alone or in combination with hydrogen and/or carbon.

To give an example, the first precursor may be an alkysilane, such as dimethylsilane, trimethylsilane or tetramethylsilane, the second precursor may be oxygen or carbon dioxide, while the third precursor may be nitrogen or ammonia.

In all cases, the proportions of the various precursors in the plasma are suitably chosen so that the atomic concentration of oxygen is less than 30% in the membrane.

As a variant, it is also possible to obtain a membrane of the $SivCwHyOz$ type with a plasma that contains only a single precursor consisting of silicon, carbon, hydrogen and oxygen while at the same time having an oxygen content equal to or less than 30 at % such as, for example, diethoxymethylsilane or octamethylcyclotetrasiloxane. Similarly, it is possible to obtain a membrane of the $SivCwNxHyOz$ type using this precursor in conjunction with another precursor consisting of nitrogen, alone or in combination with hydrogen and/or carbon.

In accordance with the invention, the plasma may furthermore contain one or more inert carrier gases, in particular hydrogen and/or argon.

Formation of the impermeable membrane by PECVD may in particular be carried out in a capacitively coupled reactor. The operating parameters are then preferably the following: excitation of the radio frequency type at 13.56 MHz; a power of between 100 and 900 W; a temperature of between 100 and 450° C.; a pressure of between 1 and 10 torr (0.133 to 1.33 kPa); and precursor flow rates of between 1 and 10000 cm3/minute.

After this operation, the characteristics of the membrane, and in particular its atomic concentration of oxygen, may be checked by composition analysis methods such as transmission infrared spectroscopy.

According to another preferred method of implementing the process of the invention, the impermeable membrane consists of a matrix which comprises at least a first material resistant to the chemical etchant and in which at least a second material degradable by said chemical etchant is dispersed.

In this case, the first material is preferably a material that comprises silicon, carbon, hydrogen and, possibly, nitrogen and/or fluorine, but contains no oxygen.

Better still, the first material is of the $SivCwHy$ type where v, w and y are all different from 0, the production of which in a dense form, in particular by PECVD using pairs of precursors of the trimethylsilane/helium or silane/methane type, is at the present time fully understood.

As regards the second material, this is preferably silicon oxide, which is one of the sacrificial materials most commonly used in microelectronics.

In accordance with the invention, it is preferable for this silicon oxide to be present in the matrix in the form of through-nanowires, that is to say nanowires that extend at least from one surface of this matrix to the other, and degradation of which nanowires by the chemical etchant will have the effect of creating diffusion channels going from one surface of said matrix to the other. These silicon oxide nanowires preferably have a diameter ranging from a few nm to a few tens of nm, and better still from 2 nm to 10 nm.

Silicon oxide nanowires may be formed by many techniques, and in particular by CVD (chemical vapour deposition), catalytic thermal decomposition, also known by the acronym CCVD (catalytic chemical vapour deposition), or else by the sol-gel route.

However, within the context of the invention, it is preferred to produce these nanowires by the sol-gel route. The matrix is then formed, preferably by PECVD, around the nanowires thus obtained. Owing to the fact that this technique permits deposition to be carried out at low pressure, it enables these nanowires to be covered, over their entire length, with the material or materials constituting the matrix, it being understood that care will be taken to adjust the duration of the deposition so that the ends of the nanowires are not included in the matrix and can thus remain accessible to the chemical etchant.

As a variant, the silicon oxide may also be present in the matrix in the form of inclusions, using for example a pore-former approach by PECVD or by spin coating.

Whatever the method of implementing the process of the invention, it is preferable for the impermeable membrane to have a thickness ranging from 10 nm to 10 μm, and better still from 100 nm to 1 μm.

Moreover, it is preferable for the sacrificial material to be silicon oxide and for the chemical etchant to be a fluid containing hydrofluoric acid.

In accordance with the invention, this fluid is preferably an aqueous or organic solution containing 1 or a few % (v/v) of hydrofluoric acid, in which case step b) may be carried out by simply dipping the microstructure into this solution.

However, it may also be gaseous hydrofluoric acid, whether pure or mixed with a carrier gas such as nitrogen, or a mixture of hydrofluoric acid and supercritical carbon dioxide, for example in a ratio of 1/100 (v/v).

As regards step c), this may be carried out conventionally, that is to say by immersion in deionized water followed by drying, for example at 100° C. for 30 minutes.

The process of the invention has many advantages, in particular that of solving all the abovementioned problems posed by the integration of permeable membranes.

Other features and advantages of the invention will become more clearly apparent on reading the rest of the description that follows and relates to examples of how the process of the invention is implemented.

Of course, these examples are given merely to illustrate the subject matter of the invention and in no way constitute a limitation of this subject matter.

For the sake of clarity, the dimensions of the various constituents of the structures shown in these figures are not in proportion with their actual dimensions.

DETAILED DESCRIPTION

Example 1

Figure 1A:
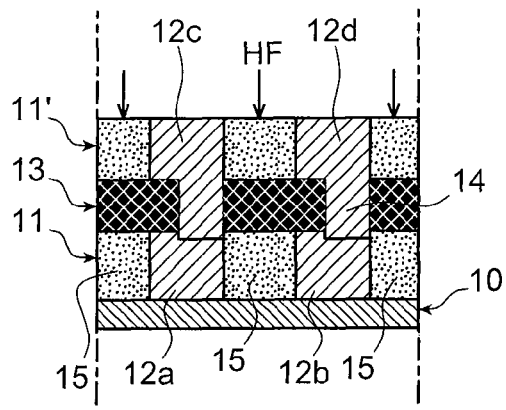
FIGS. 1A and 1B, already commented upon, illustrate schematically a process for producing air gaps according to the prior art, in the case of an interconnect structure for integrated circuits.
Figure 1B:
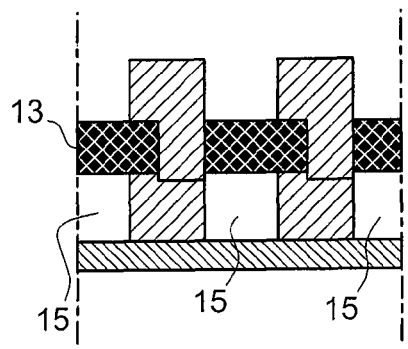
Figure 2A:
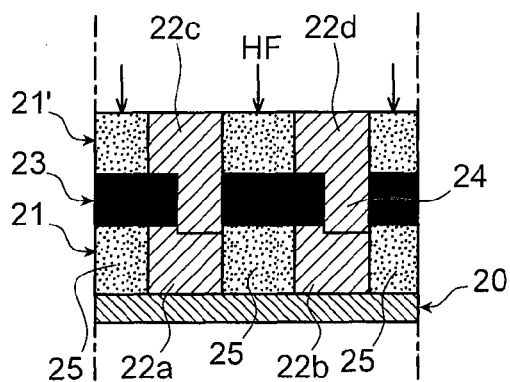
FIGS. 2A and 2B illustrate schematically a first example of how to implement the process for producing air gaps according to the invention, in the case of an interconnect structure for integrated circuits.
Figure 2B:
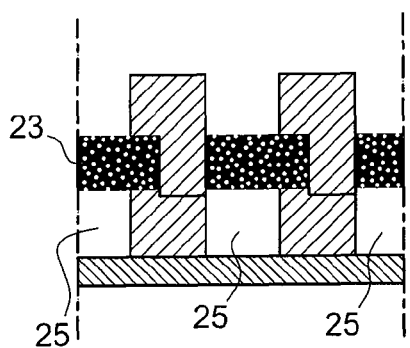

Reference is firstly made to FIGS. 2A and 2B which illustrate, in schematic form, a first example of how to implement the process of the invention in order to produce air gaps in an interconnect structure for integrated circuits.

In this example, the sacrificial material is silicon oxide while the impermeable membrane is an SivCwNxHyOz membrane (where v, w, x, y and z are all different from 0) which has an oxygen content of around 10 at % and a thickness of 200 nm.

Firstly, the structure shown in FIG. 2A comprising SiO2-filled cavities 25 is produced.

To do this, a first level of interconnects is produced on a suitable semiconductor substrate, typically made of silicon, said interconnects comprising metal lines 22*a* and 22*b*, typically made of copper, which are embedded in an $SiO_2$ first layer 21. This first level of interconnects may be produced using a conventional route, i.e. for example by:

- deposition of an $SiO_2$ layer 21 on the substrate;
- definition of a pattern of interconnects on the $SiO_2$ layer 21 by a lithography process using a hard mask;
- etching of the $SiO_2$ layer 21 through the mask until the substrate 20 is revealed; and then
- formation of the metal lines 22*a* and 22*b* in the etching pattern.

Next, an impermeable membrane 23 is deposited on this first level of interconnects by PECVD using tetramethylsilane, oxygen, ammonia and helium, for example in one of the capacitively coupled PECVD deposition chambers of a Centura® DxZ 200 mm machine from the company Applied Materials, and using the following operating parameters:

- radiofrequency excitation: 13.56 MHz;
- working pressure: 3 torr (0.4 kPa);
- power: 310 W;
- deposition temperature: 350° C.;
- tetramethylsilane flow rate: 80 cm³/min;
- oxygen flow rate: 10 cm³/min;
- ammonia flow rate: 160 cm³/min;
- helium flow rate: 200 cm³/min;
- deposition duration: 1 minute.

After this deposition, a second level of interconnects comprising metal lines 22*c* and 22*d* embedded in a second SiO₂ layer 21' is produced on the membrane 23, here again using a conventional route, these lines being connected to the metal lines 22*a* and 22*b* respectively by means of vias 24.

Of course, it is possible using the same principle to produce other levels of interconnects, these being separated each time from the previous level of interconnects by an impermeable membrane identical to the membrane 23.

The structure is then immersed in a 1% (v/v) aqueous hydrofluoric acid solution for 20 minutes, this having the effect of degrading the SiO2 layer 21' of the second level of interconnects, so as to make the membrane 23 permeable by selectively destroying the Si—O bonds that it contains, and then degrading the SiO2 layer 21 of the first level of interconnects. The hydrofluoric acid treatment time is determined depending on the thickness of the layer 21 (about 1 minute per 10 nm), adding on 5 minutes of treatment in order to degrade the Si—O bonds of the membrane 23.

After having removed the structure from the hydrofluoric acid solution, it is immersed in deionized water and then dried at 100° C. for 30 minutes.

What is thus obtained is the structure illustrated in FIG. 2B, in which the cavities 25 are filled with air.

Example 2

Figure 3A:
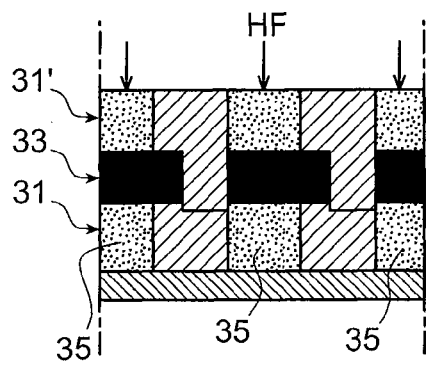
FIGS. 3A and 3B illustrate schematically a second example of how to implement the process for producing air gaps according to the invention, in the case of an interconnect structure for integrated circuits.
Figure 3B:
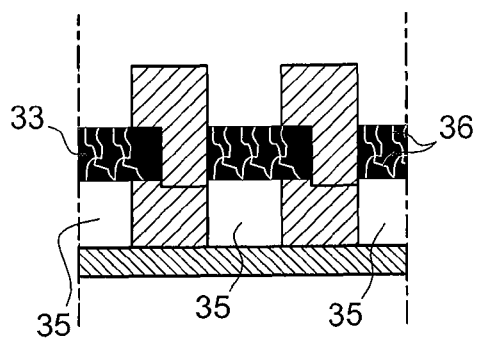

Reference is now made to FIGS. 3A and 3B which illustrate schematically a second example of how to implement the process of the invention in order to produce air gaps in an interconnect structure for integrated circuits, which differs from that described in Example 1 only by the nature of the impermeable membrane integrated into the structure.

Specifically, in the present example, the impermeable membrane 33 consists of an amorphous hydrogenated silicon carbide (a-SiC:H) matrix, 200 nm in thickness, in which $SiO_2$ through-nanowires are dispersed.

To obtain this membrane, the SiO2 nanowires are firstly formed on the first level of interconnects of the structure.

To do this, a first solution is prepared by gradually adding 52 ml of tetraethylorthosilicate (TEOS) to 115 mL of ethanol and a second solution is prepared by mixing 115 mL of ethanol with 18 mL of water and 0.27 mL of hydrochloric acid. The second solution is then added to the first. The resulting mixture is spin-coated onto the first level of interconnects and the structure is placed in a heated enclosure (at 200° C.) for 12 hours.

The $Si_xC_wH_y$ matrix is then formed around the $SiO_2$ nanowires thus obtained, by PECVD using trimethylsilane and helium, for example in a capacitively coupled reactor of the Centura® 5200 DxZ type from the company Applied Materials, and using the following operating parameters:

- radio frequency excitation: 13.56 MHz;
- working pressure: 4 torr (533 Pa);
- power: 250 W;
- deposition temperature: 350-400° C.;
- trimethylsilane flow rate: 350 cm³/min;
- helium flow rate: 4900 cm³/min;
- deposition duration: 8 minutes.

The membrane thus formed then undergoes a chemical-mechanical polishing operation for 10 seconds by means of a basic (pH 8) aqueous suspension of colloidal silica particles and using a plate rotation speed of 80 rpm and a pressure of 2 psi (13.789 kPa).

As in Example 1, to replace the SiO2-filled cavities 35 of the structure shown in FIG. 3A by air gaps (FIG. 3B), all that is required is:

to immerse the structure in a 1% (v/v) aqueous hydrofluoric acid solution for 20 minutes, this having the effect of degrading the SiO2 layer 31' of the second level of interconnects, of making the membrane 33 permeable by selectively degrading the SiO2 nanowires and creating diffusion through-channels (with the reference 36 in FIG. 3B) and finally of degrading the SiO2 layer 31 of the first level of interconnects; and then to remove the structure from the hydrofluoric acid solution, immerse it in deionized water and then dry it at 100° C. for 30 minutes.

The invention claimed is:

1. A process for producing at least one air gap in a microstructure, the process comprising:
   a) providing a microstructure comprising at least one gap filled with a sacrificial material, wherein the gap is coated with an impermeable membrane, and wherein the impermeable membrane is rendered permeable by the action of a chemical etchant that is capable of degrading the sacrificial material, the chemical etchant comprising hydrofluoric acid or ammonium fluoride, or both;
   b) contacting the microstructure with the chemical etchant to make the impermeable membrane permeable and to allow the chemical etchant to diffuse through the permeable membrane so as to degrade the sacrificial material; and
   c) removing the chemical etchant from the microstructure, thereby obtaining the at least one air gap closed by the permeable membrane.

2. The process according to claim 1, wherein the impermeable membrane comprises one material.

3. The process according to claim 2, wherein the one material comprises silicon, carbon, hydrogen, oxygen and, optionally, nitrogen or fluorine, wherein the one material comprises a majority of silicon-carbon bonds and a proportion of silicon-oxygen bonds, such that the oxygen in the material comprises at most 30% of the number of atoms.

4. The process according to claim 3, wherein the one material comprises $Si_vC_wH_yO_z$ or $Si_vC_wN_xH_yO_z$, where v, w, x, y and z are nonzero coefficients.

5. The process according to claim 3, wherein providing the impermeable membrane comprises a plasma-enhanced chemical vapour deposition process.

6. The process according to claim 5, wherein the impermeable membrane comprises $Si_vC_wH_yO_z$ and the plasma-enhanced chemical vapour deposition process comprises an organosilicon first precursor free of oxygen and a second precursor comprising oxygen alone or in combination with carbon or hydrogen, or both.

7. The process according to claim 6, wherein the first precursor comprises an alkylsilane and the second precursor comprises oxygen or carbon dioxide.

8. The process according to claim 5, wherein the membrane comprises $Si_vC_wN_xH_yO_z$ and the plasma deposition process comprises an organosilicon first precursor free of oxygen, a second precursor comprising oxygen alone or in combination with carbon or hydrogen, or both, and a third precursor comprising nitrogen alone or in combination with hydrogen or carbon, or both.

9. The process according to claim 8, wherein the first precursor comprises an alkylsilane, the second precursor comprises oxygen or carbon dioxide, and the third precursor comprises nitrogen or ammonia.

10. The process according to claim 1, wherein the impermeable membrane comprises at least a first material resistant to the chemical etchant and at least a second material dispersed in the first material, wherein the second material is degradable by the chemical etchant.

11. The process according to claim 10, wherein the first material comprises silicon, carbon, hydrogen and, optionally, nitrogen or fluorine or both, and is oxygen free.

12. The process according to claim 11, wherein the first material comprises $Si_vC_wH_y$, where v, w and y are all nonzero coefficients.

13. The process according to claim 10, wherein the second material comprises silicon oxide.

14. The process according to claim 13, wherein the impermeable membrane comprises a matrix, and wherein the silicon oxide comprises through-nanowires in the matrix.

15. The process according to claim 14, wherein the silicon oxide nanowires are formed by a sol-gel process.

16. The process according to claim 13, wherein the impermeable membrane comprises a matrix, and wherein the silicon oxide comprises inclusions in the matrix.

17. The process according to claim 1, wherein the sacrificial material comprises silicon oxide.

18. The process according to claim 1, wherein the chemical etchant comprises a fluid comprising hydrofluoric acid.

19. The process according to claim 18, wherein the fluid comprises an aqueous or organic hydrofluoric acid solution, gaseous hydrofluoric acid, a mixture of gaseous hydrofluoric acid and a carrier gas, or a mixture of hydrofluoric acid and supercritical carbon dioxide.

20. The process according to claim 1, wherein providing the microstructure comprises providing an interconnect structure for integrated circuits.

\* \* \* \* \*